Feb. 20, 1962 H. A. LEEDER, JR 3,022,467
OSCILLATOR CIRCUIT WITH POWER TRANSISTOR OUTPUT STAGE
Filed July 15, 1959
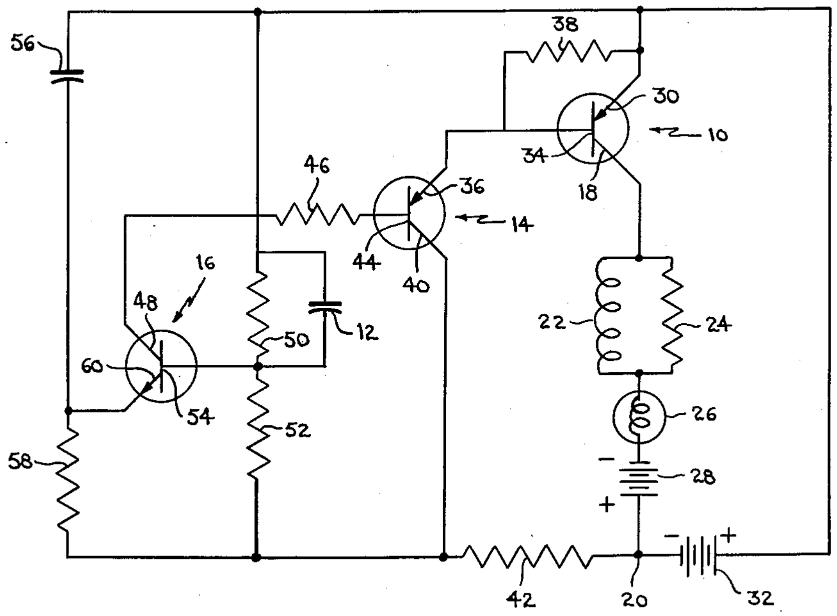
INVENTOR.
HARRY A. LEEDER, Jr.
BY Richard von K. Bruns
Atty.

United States Patent Office 3,022,467

Patented Feb. 20, 1962

3,022,467

OSCILLATOR CIRCUIT WITH POWER TRANSISTOR OUTPUT STAGE

Harry A. Leeder, Jr., Skaneateles, N.Y., assignor to R. E. Dietz Company, Syracuse, N.Y., a corporation of New York Filed July 15, 1959, Ser. No. 827,374
4 Claims. (Cl. 331—74)

This invention relates generally to electrical signal generators, and has particular reference to such circuits wherein semi-conductor devices are utilized.

The circuit of the invention is particularly adapted for use in flasher type hazard warning lamps such as may be used to warn motorists of road repairs or disabled vehicles, although it will be apparent as the description proceeds that it can also be advantageously employed for various other purposes. In this connection, reference is made to U.S. Patent No. 2,829,257, issued April 1, 1958 to Elihu Root 3rd, said patent and the present application being commonly owned. Patent No. 2,829,257 discloses a semi-conductor circuit of the type referred to above, and points out some of the advantages of such a circuit over prior electrical arrangements.

The circuit to be disclosed herein differs from the patented circuit referred to in that it functions as a multivibrator for producing high power current pulses in a suitable load using a power transistor. Accordingly, it may be stated that the primary object of the present invention is to provide an electronic switching device which is particularly adapted for use in flasher lamps where high light output is required.

Another important object of the invention is to provide a transistor oscillator circuit of the character described which is highly efficient in operation.

A further important object of the invention is to provide a transistor oscillator circuit of the character described wherein the timing of the operating cycles can be closely controlled.

Other objects and advantages of the invention will become apparent from the following detailed description thereof read in conjunction with the accompanying drawing which illustrates a representative embodiment of the invention for the purposes of disclosure.

In the drawing, the single figure is a schematic circuit diagram of a transistor oscillator circuit arranged in accordance with the present invention.

Referring specifically to this circuit diagram, the circuit includes three transistor stages, the final stage utilizing a power transistor indicated generally at 10. The portion of the circuit to the left of the power transistor is substantially the same as that disclosed in the patent No. 2,829,257, supra, with the addition of a capacitor 12 to provide improved performance as will be explained. Thus, this left hand portion of the circuit includes complementary transistors 14 and 16, transistor 14 being shown by way of example as a PNP type and transistor 16 as an NPN type.

The power transistor 10 is of the same semi-conductor type as transistor 14 and is arranged in the circuit so that its collector and emitter electrodes are interconnected through the main load and a source of direct current. To this end, the collector electrode 18 of the power transistor is connected to a terminal 20 through a series circuit consisting of the parallel combination of an inductor 22 and resistor 24, the main load 26 and a battery 28. Terminal 20 is in turn connected to the emitter electrode 30 of the power transistor through a battery 32 which provides the operating power for transistors 14 and 16 and part of the power for the main load 26.

The base electrode 34 of the power transistor is connected to the emitter electrode 36 of transistor 14. In addition, a component 38 is connected between the emitter and base electrodes of the power transistor to provide thermal protection for the collector current of the transistor. While component 38 is shown as a resistor in the drawing, it will be apparent to those familiar with the art that other means can be used to perform the same function. The collector electrode 40 of the transistor 14 is connected through a component 42 to the terminal 20. Component 42, which would be the load in the circuit of the above mentioned Root patent, is the auxiliary load in the present circuit and can be a resistor as shown, or a small lamp or other load device.

As in Patent No. 2,829,257, the base electrode 44 of transistor 14 is connected through an impedance, such as a resistor 46, to the collector electrode 48 of transistor 16. A voltage divider comprising resistors 50, 52 is connected across the auxiliary load 42 and battery 32, and the base electrode 54 of transistor 16 is connected to an intermediate point on this voltage divider. The capacitor 12, previously referred to, is connected across resistor 50 as shown. A series connected combination of a capacitor 56 and resistor 58 is also connected across the auxiliary load 42 and battery 32, and the emitter electrode 60 of transistor 16 is connected to the common junction point of this capacitor-resistor combination.

The operation of the above described circuit is substantially as follows: At the start of a cycle, all of the transistors are momentarily non-conducting and there is substantially no charge on capacitor 56. The mode of operation of transistors 14 and 16 in conjunction with the auxiliary load 42 and battery 32 is substantially the same as described in the Root patent. Thus, briefly stated, current supplied from battery 32 to the voltage divider 50, 52 holds the base electrode 54 of transistor 16 at an intermediate potential which is less than that of the battery. At the same time, current from battery 32 charges the capacitor 56 through resistor 58 causing the emitter electrode 60 of transistor 16 to become more negative than the intermediate potential at the base electrode thereof. Transistor 16 then begins to conduct and its load current flows through impedance 46 to the base electrode 44 of transistor 14 whereby the latter is also rendered conductive.

When transistor 14 starts to conduct, its emitter current is supplied from battery 32 through the emitter to base path of the power transistor 10. By transistor action, a larger current is caused to flow from the emitter to the collector electrode of the power transistor thereby completing the circuit through the main load 26, batteries 28 and 32, and back to the emitter electrode of the power transistor. Essentially the full potential of battery 28 and battery 32 is then applied across the main load.

The load and control currents for transistor 16 are controlled entirely by capacitor 56 which discharges mainly through impedance 46. Eventually, the potential of this capacitor falls so low that it cannot maintain sufficient control current for full conduction by either transistor 16 or transistor 14, and when this happens a rapid reverse switching action sets in until both of these transistors are completely shut off. As a result, transistor 14 ceases to draw emitter current through the power transistor so that the latter also shuts off and opens the circuit through the main load 26. All of the transistors are therefore completely shut off which brings the base electrode 54 of transistor 16 back to its original intermediate potential, and a new cycle begins.

In the operation of transistors 14 and 16, there is one important difference between the present circuit and that of Patent No. 2,829,257 which is caused by capacitor 12. Thus, when the circuit is in the "off" condition, capacitor 12 charges up to a fraction of the potential of battery 32, as determined primarily by resistors 50, 52. When the circuit switches on to the "on" condition, the voltage across capacitor 12 causes the initial current flow in the collector electrode 48 of transistor 16 to be smaller than it would be if the capacitor were absent. The result is that "on" period of the cycle is increased.

The combination of inductor 22 and resistor 24 is used to compensate for the thermal characteristics of a lamp load 26. If a large lamp is used without compensation, the power transistor will carry a high collector current at high power dissipation from the instant that the circuit switches "on" until the filament of the lamp reaches operating temperature. By properly selecting the values of inductor 22 and resistor 24, the power transistor can be driven into saturation quickly and held there for the duration of the "on" cycle. The power transistor can, therefore, switch a heavier load without exceeding its dissipation rating. With smaller lamp loads the compensation circuit can be eliminated, and the collector electrode 18 can be connected directly to the load 26.

While this invention has been described with transistor 16 as an NPN type and transistors 10 and 14 as PNP types, it will be understood that the circuit can be used with transistor 16 as a PNP type and transistors 10 and 14 as NPN types provided that the polarities of the two batteries are reversed.

As will be apparent to those familiar with the art, the invention may be embodied in other specific forms without departing from the spirit or essential characteristics thereof. The embodiment disclosed is therefore to be considered in all respects as illustrative rather than restrictive, the scope of the invention being indicated by the appended claims.

What is claimed is:

1. In an electronic switching circuit: a first transistor having its collector and emitter electrodes interconnected through a series circuit including a parallel resistor-inductor combination, a main load and a source of direct current, said first transistor having a temperature stabilizing resistor connected between its base and emitter electrodes, a second transistor of the same semi-conductor type as said first transistor, said second transistor having its emitter electrode connected to the base electrode of said first transistor and its collector electrode connected through an auxiliary load to an intermediate point on said current source, a third transistor of complementary semi-conductor type, said third transistor having its collector electrode connected to the base electrode of said second transistor, means in said circuit to establish a reference potential less than that of said source at one of the remaining electrodes of said third transistor, and means in said circuit including a capacitor to alter the potential at the other remaining electrode of said third transistor relative to said reference potential whereby the third transistor is rendered conductive and energizes the base electrode of said second transistor causing it to conduct, said second transistor in turn causing said first transistor to conduct by reason of said emitter to base coupling whereby the circuit through said load, source and first transistor is completed.

2. In a transistor oscillator circuit: a first transistor having its collector and emitter electrodes interconnected through a series circuit including a parallel resistor-inductor combination, a load and a source of direct current, a second transistor having its emitter electrode connected to the base electrode of said first transistor and its collector electrode connected through an impedance to an intermediate point on said current source, a third transistor having its collector electrode connected to the base electrode of said second transistor, a voltage divider in said circuit operable to establish a potential less than that of said source at the base electrode of said third transistor, and means in said circuit including a capacitor to alter the potential at the emitter electrode of said third transistor relative to the base electrode thereof whereby said third transistor is rendered conductive and energizes the base electrode of said second transistor causing it to conduct and a second capacitor connected across a portion of said voltage divider for decreasing the initial current flow in the collector electrode of the third transistor, said second transistor drawing emitter current from the said current source through said first transistor whereby the latter is brought to a state of full conduction and substantially the full potential of said current source is applied across said load, said first and second transistors being of the same semi-conductor type and said third transistor being of a complementary semi-conductor type.

3. In a transistor oscillator circuit: a power transistor having its collector and emitter electrodes interconnected through a series circuit including a parallel resistor-inductor combination, a load and a source of direct current, said power transistor having a temperature stabilizing resistor connected between its base and emitter electrodes, a second transistor having its emitter electrode connected to the base electrode of said power transistor and its collector electrode connected through an auxiliary load to an intermediate point on said current source, a third transistor having its collector electrode connected through an impedance to the base electrode of said second transistor, a voltage divider connected across said source and load, the base electrode of said third transistor being connected to an intermediate point on said voltage divider to establish a reference potential less than that of said source at said base electrode, a series connected capacitor-resistor combination connected across said source and load, the emitter electrode of said third transistor being connected to the junction of said capacitor and resistor, said capacitor being operable to alter the potential at the emitter electrode of said third transistor relative to the reference potential at the base electrode thereof whereby said third transistor is rendered conductive and energizes the base electrode of said second transistor causing it to conduct, and a second capacitor connected across the portion of said voltage divider that applies said reference potential to the base electrode of said third transistor for decreasing the initial current flow in the collector electrode of the third transistor, said second transistor being operable when conducting to draw its emitter current from said current source through said power transistor whereby the latter is brought to a state of full conduction and substantially the full potential of said current source is applied across said load, said power and second transistors being of the same semi-conductor type and said third transistor being of a complementary semi-conductor type.

4. In a transistor oscillator circuit: a power transistor having a temperature stabilizing resistor connected between its base and emitter electrodes, said power transistor having its collector electrode connected to its emitter electrode through a series circuit including a parallel resistor-inductor combination, load and battery; a second transistor having its emitter electrode connected to the base electrode of said power transistor, said second transistor having its collector electrode connected through an auxiliary load to a point of intermediate battery potential; a third transistor having its collector electrode connected through an impedance to the base electrode of said second transistor, said third transistor having its base electrode connected to the junction of two paths, the first connected through a resistance to the collector electrode of said second transistor, and the second connected through a parallel combination of resistance and capacitance to the emitter electrode of said power transistor, and having its emitter electrode connected to the junction of two paths, the first connected through a resistor to the collector electrode of said second transistor, and the second connected through a capacitor to the emitter electrode of said power transistor.

References Cited in the file of this patent

UNITED STATES PATENTS

| | | |
|---|---|---|
| 2,776,420 | Woll | Jan. 1, 1957 |
| 2,829,257 | Root | Apr. 1, 1958 |
| 2,892,100 | Huang et al. | June 23, 1959 |
| 2,892,165 | Lindsay | June 23, 1959 |